United States Patent [19]

Nakamura et al.

[11] Patent Number: 5,159,300
[45] Date of Patent: Oct. 27, 1992

[54] NOISE FILTER COMPRISING A MONOLITHIC LAMINATED CERAMIC VARISTOR

[75] Inventors: Kazutaka Nakamura; Yasunobu Yoneda; Yukio Sakabe; Yukio Sakamoto; Hidetoshi Yamamoto; Seiji Sakai, all of Nagaokakyo, Japan

[73] Assignee: Murata Manufacturing Co. Ltd., Japan

[21] Appl. No.: 549,221

[22] Filed: Jul. 6, 1990

[30] Foreign Application Priority Data

Jul. 7, 1989 [JP] Japan ................. 1-176370

[51] Int. Cl.$^5$ ................. H01C 7/10; H01P 7/00
[52] U.S. Cl. ................. 333/184; 333/185; 338/21
[58] Field of Search ............. 333/12, 181, 184, 185; 338/20, 21, 204; 361/306, 111, 321

[56] References Cited

U.S. PATENT DOCUMENTS

| | | | |
|---|---|---|---|
| 4,212,045 | 7/1980 | Martzloff | 338/21 X |
| 4,290,041 | 9/1981 | Utsumi et al. | 338/21 |
| 4,746,557 | 5/1988 | Sakamoto et al. | 333/184 X |
| 4,785,276 | 11/1988 | May | 338/21 |
| 4,920,328 | 4/1990 | Hayashi et al. | 338/21 |
| 5,034,709 | 7/1991 | Azumi et al. | 333/185 X |

FOREIGN PATENT DOCUMENTS

| | | | |
|---|---|---|---|
| 0285906 | 11/1988 | Japan . | |
| 0296316 | 12/1988 | Japan | 338/21 |
| 0107511 | 4/1989 | Japan . | |

Primary Examiner—Eugene R. LaRoche
Assistant Examiner—Seung Ham
Attorney, Agent, or Firm—Ostrolenk, Faber, Gerb & Soffen

[57] ABSTRACT

A noise filter of a monolithic type in which a common electrode is formed in a sintered body having varistor characteristics so as to extend from a first portion to a second portion of side surfaces of the sintered body, and at least one through electrode is formed in a position at a height spaced apart from the common electrode through a sintered body layer in the direction of thickness so as to extend from a third portion to a fourth portion of the side surfaces of the sintered body and to intersect the common electrode.

8 Claims, 9 Drawing Sheets

NOISE FILTER COMPRISING A MONOLITHIC LAMINATED CERAMIC VARISTOR

BACKGROUND OF THE INVENTION

1. Field of the Invention

The present invention relates to a noise filter constructed of a nonolithic sintered body obtained by laminating a plurality of ceramic green sheets having varistor characteristics which separate a set of electrodes, followed by cofiring.

2. Description of the Prior Art

In recent years, the development of microcomputers has resulted in microcomputers being incorporated in various apparatus such as industrial equipment, household electrical appliances and communications equipment.

Equipment carrying a microcomputer for digital control processing is liable to be destroyed or erroneously operated due to noise. An accident can actually happen due to noise. In many cases, the path of entrance of noise into the equipment is a power supply portion and a signal interconnection portion. Consequently, the function of a noise filter used in an input/output portion is taken seriously.

In order to solve the problem of EMI noise, it is necessary that the noise does not go in and out of the equipment. The noise normally goes in and out of the equipment through an electric wire. Consequently, a method of connecting a noise filter to the electric wire in the vicinity of the input/output portion of the equipment has been most commonly used.

As noise filters conventionally used, the following noise filters have been known: (a) one using a capacitor, (b) the capacitor-inductor composite system, (c) one using an inductor, and (d) one using a varistor.

The noise filter using a capacitor (a) is superior in that it reduces very small noise but cannot absorb a high-voltage pulse such as a static charge by only the capacitor. Accordingly, the destruction and the maulfunction of an apparatus or equipment incorporating the noise filter based on high-voltage pulse noise cannot be prevented.

The noise filter of the capacitor-inductor composite system (d) is suitable for absorption of white noise or the like. In addition, the noise filter using a varistor (d) is suitable for absorption of transient noise.

However, absorption of noise on a signal line is closely related to the frequency of a signal. Further, since digitization has recently proceeded, large distortion must not occur in a waveform. Therefore, the noise filter cannot be used as a noise filter for a signal line if its capacitance is too large. In addition, the withstanding voltage of an IC is approximately 60 to 70 volts. Accordingly, a noise component must be suppressed to 60 to 70 volts or less.

The noise filter of the capacitor-inductor system has no problem in terms of its capacitance. However, there is a problem that the transient noise in a resonance frequency band is passed without any modification, thereby to make it impossible to protect a circuit. Furthermore, in the case of high-voltage noise, the waveform can be changed but its peak value cannot be greatly restrained.

In the noise filter using a varistor, on the other hand, if its capacitance is 500 pF or more and a signal of hundreds of kilohertzs to tens of megahertzs such as a signal which is passed on a signal line is handled, the signal per se may be absorbed or deformed. Presently, therefore, a varistor is not commonly used as a device for reducing noise on the signal line.

SUMMARY OF THE INVENTION

The object of the present invention is to provide a noise filter whose capacitance is reduced, thereby to make it difficult to absorb and deform a signal, while taking advantage of characteristics of a varistor superior in absorption of transient noise.

The present invention provides a noise filter superior to a filter of the capacitor-inductor system as a noise filter for a signal line by paying attention to dielectric characteristics of a varistor and effectively utilizing the characteristics.

The noise filter according to the present invention is constructed by utilizing a sintered body obtained by laminating a plurality of ceramic green sheets having varistor characteristics through electrodes, followed by cofiring. More specifically, a comon electrode is formed in the sintered body so as to extend from a first portion to a second portion on side surface of the sintered body having varistor characteristics. At least one through electrode is formed in a position at a height spaced apart from the common electrode through a sintered body layer in the direction of thickness so as to extend from a third portion to a fourth portion on the side surfaces of the sintered body and to intersect the above common electrode.

According to the present invention, the noise filter is constructed by utilizing a sintered body obtained by laminating ceramic green sheets having varistor characteristics through the electrodes, followed by cofiring. Consequently, the noise filter is of a monolithic type and thus, a varistor voltage can be lowered, thereby to make it possible to enhance the circuit protecting effect. In addition, the through electrode or electrodes are formed so as to intersect the common electrode. Accordingly, the electrode-overlapping area in a varistor characteristic portion can be decreased, thereby to make it possible to lower the capacitance of the noise filter. Moreover, the varistor characteristic portion is of a distribution type. Accordingly, the unnecessary inductance is decreased, thereby to improve the varistor characteristics.

Therefore, a noise filter has small capacitance and both noise absorbabilities due to a capacitor and a varistor, thereby to make it possible to effectively absorb noise in a wide variety of forms such as white noise and transient noise. Accordingly, the malfunction and the destruction of an apparatus or equipment incorporating the noise filter can be effectively prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Raw materials are weighed so as to have composition containing 97.5 mol % of ZnO, 0.5 mol % of $Bi_2O_3$, 0.5 mol % of $Co_2O_3$, 0.5 mol % of MnO, and 0.5 mol % of $Sb_2O_3$ and water is added to the raw materials, followed by grinding by a ball mill.

Slurry obtained in the above described manner is dehydrated and dried. Thus obtained dried powder is calcined for two hours at a temperature of 780° C.

The calcined materials are ground with an organic binder. Further ethyl alcohol is added thereto as a solvent such that the materials take the form of slurry. A green sheet having a thickness of 60 μm is obtained using this slurry by the Doctor blade process.

Figure 1:
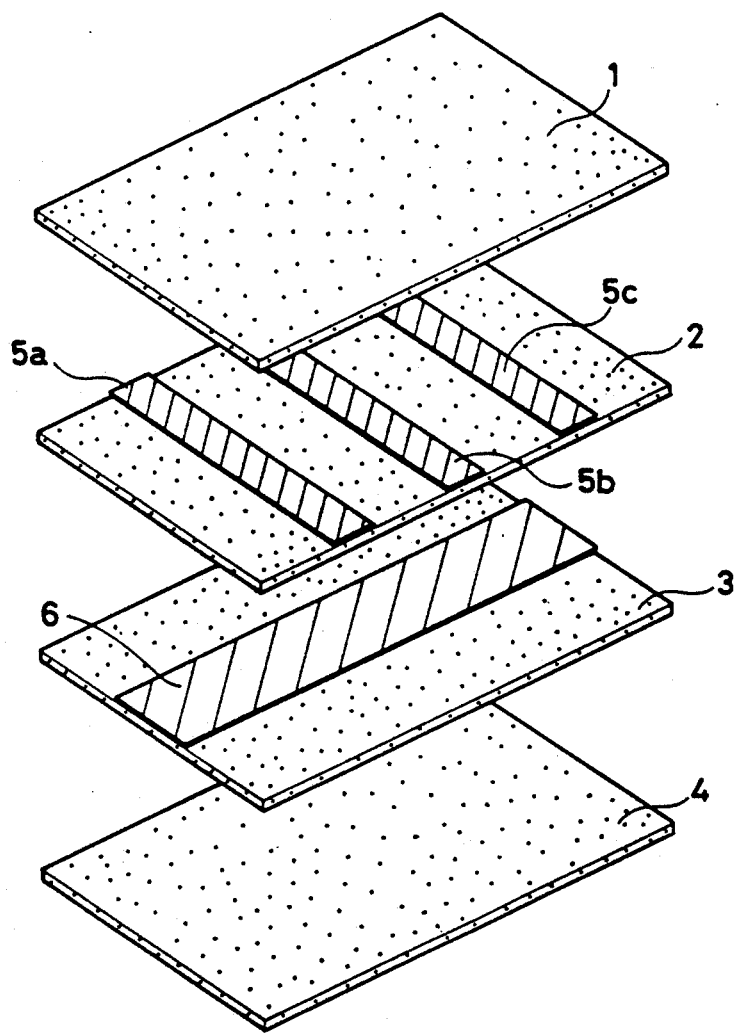
FIG. 1 is an exploded perspective view for explaining ceramic green sheets used for obtaining a first embodiment of the present invention and the shapes of electrodes formed thereon.

The green sheet obtained is punched to be of a predetermined size and shape, to obtain ceramic green sheets 1 to 4 as shown in FIG. 1.

Conductive pastes containing Ag and Pd to have the weight ratio of 7:3 are applied on upper surfaces of the ceramic green sheets 2 and 3, to form through electrode portions 5a to 5c and a common electrode portion 6. Description is now made by assigning the same reference numerals as those of the common electrode portion and the through electrode portions to a common electrode and through electrodes formed after sintering.

Three ceramic green sheets identical to the ceramic green sheets 1 to 4 are respectively laminated on upper and lower surfaces of the ceramic green sheets 1 and 4, followed by applying pressure of 2 ton/cm².

Figure 2:
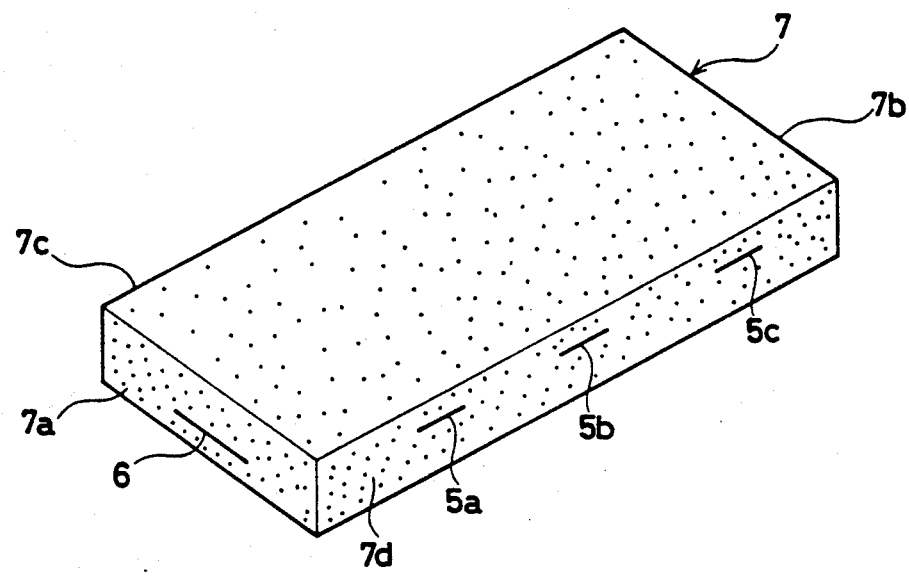
FIG. 2 is a perspective view showing a sintered body obtained in the first embodiment of the present invention.

A laminated body chip obtained is sintered for two hours at a temperature of 1100° C., to obtain a sintered body 7 shown in FIG. 2.

In the sintered body 7, a common electrode 6 is formed between a first side surface 7a and a second side surface 7b which are opposed to each other. Similarly, three through electrodes 5a, 5b and 5c are formed so as to extend between a third side surface 7c and a fourth side surface 7d and to intersect the common electrode 6.

Conductive pastes containing Ag and Pd at a weight ratio of 7:3 are then printed in portions, which are exposed to the side surfaces of the sintered body 7, of the above through electrodes 5a to 5c and the above common electrode 6 and are baked for thirty minutes at a temperature of 1000° C., thereby to form outer electrodes. Thus obtained noise filter having the outer electrodes is shown in FIG. 3.

Figure 3:
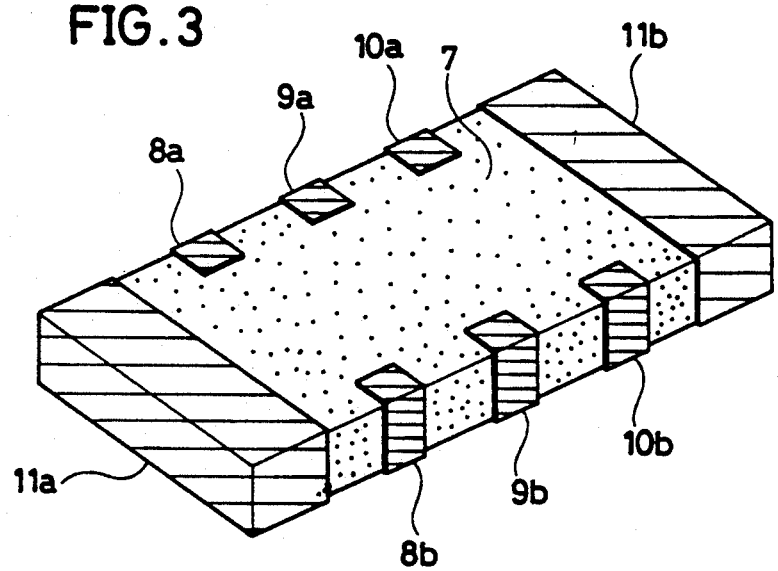
FIG. 3 is a perspective view showing the appearance of a noise filter according to the first embodiment of the present invention.

In FIG. 3, both ends of the through electrodes 5a to 5c (see FIG. 2) are electrically connected to outer electrodes 8a, 8b, 9a, 9b, 10a and 10b, respectively. Both ends of the common electrode 6 (see FIG. 2) are electrically connected to outer electrodes 11a and 11b.

The widths of the through electrodes 5a to 5c are set to 0.7 mm, the width of the common electrode 6 is set to 1.0 mm and the spacing between the through electrodes 5a to 5c is set to 1.2 mm.

Figure 4:
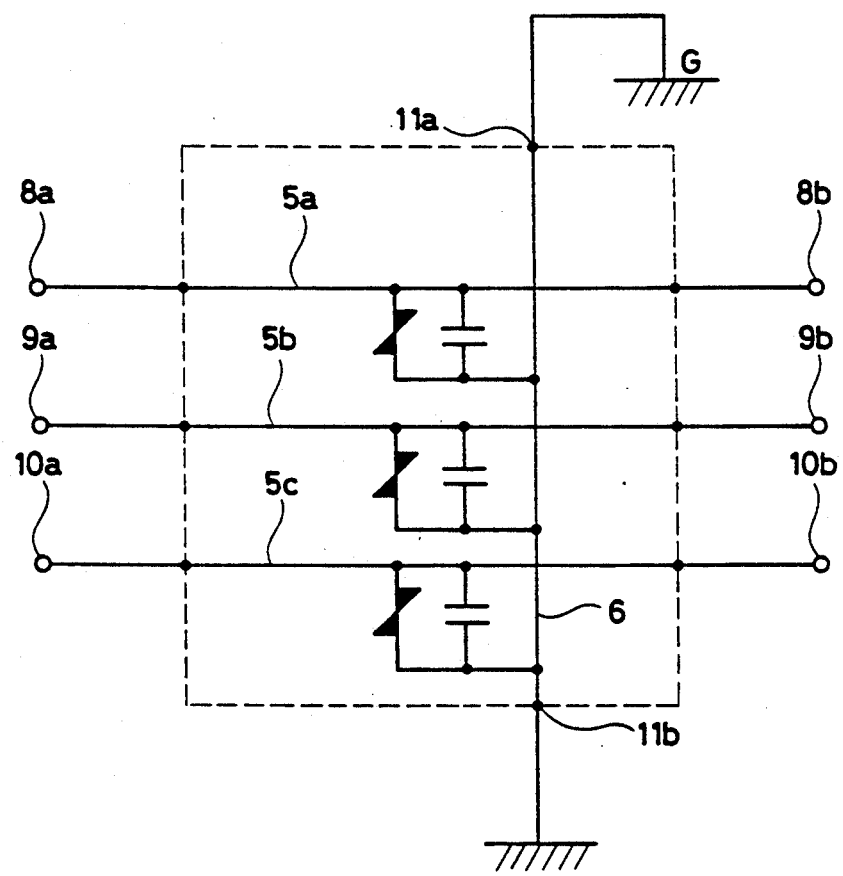
FIG. 4 is a circuit diagran showing the noise filter according to the first embodiment of the present invention.

FIG. 4 illustrates a circuit structure of a noise filter obtained.

Characteristics of the noise filter obtained in the above described manner according to the present embodiment are shown in the following table 1. In the table 1, the electrodes 8a to 10a described below an item "between common electrode and through electrode" are respectively characteristics between the outer electrode 11a electrically connected to the common electrode 6 and the outer electrode 8a, 9a and 10a. In addition, 8a-9a and 9a-10a described below an item "between through electrodes" are respectively characteristics between the outer electrodes 8a and 9a and between the outer electrodes 9a and 10a which are connected to the through electrodes 5a to 5c.

TABLE 1

| | between common electrode and through electrode | | | between through electrodes | |
|---|---|---|---|---|---|
| | electrode 8a | electrode 9a | electrode 10a | 9a-10a | 8a-9a |
| varistor voltage (V) | 13.2 | 12.9 | 13.1 | 26.4 | 26.3 |
| capacitance (pF) | 124 | 127 | 125 | 60 | 58 |
| α | 24.7 | 26.5 | 25.6 | 32.1 | 31.6 |

The varistor voltage is measured by applying a current flow of 0.1 mA to the noise filter obtained in the present embodiment. The voltage non-linearity index α is calculated from the following equation, where its voltage values of $V_{0.1}$ and $V_1$ are at 0.1 mA and 1 mA, respectively.

$$\alpha = 1/\log (V_1/V_{0.1})$$

Figure 5:
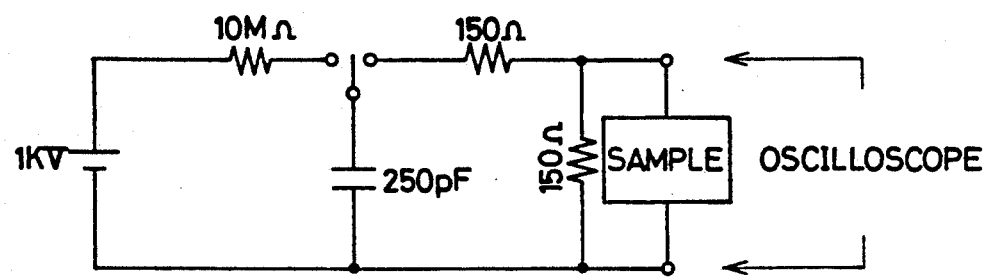
FIG. 5 is a diagram showing a circuit used for measuring the noise filter.

A measuring circuit shown in FIG. 5 is used, and the above described noise filter is inserted thereinto as a sample. A pulse of 1 kilovolts is applied between the outer electrodes 10b and 11a of the noise filter, to observe the change in waveform at that time. For comparison, the same pulse is applied to a filter using a capacitor comprising an ordinary dielectric ceramic chip and a filter of a disk-shaped 20-volts varistor, to observe the change in waveform at that time. The changes in waveform in the noise filter in the embodiment and in the noise filter in the comparative examples are shown in FIG. 6.

Figure 6:
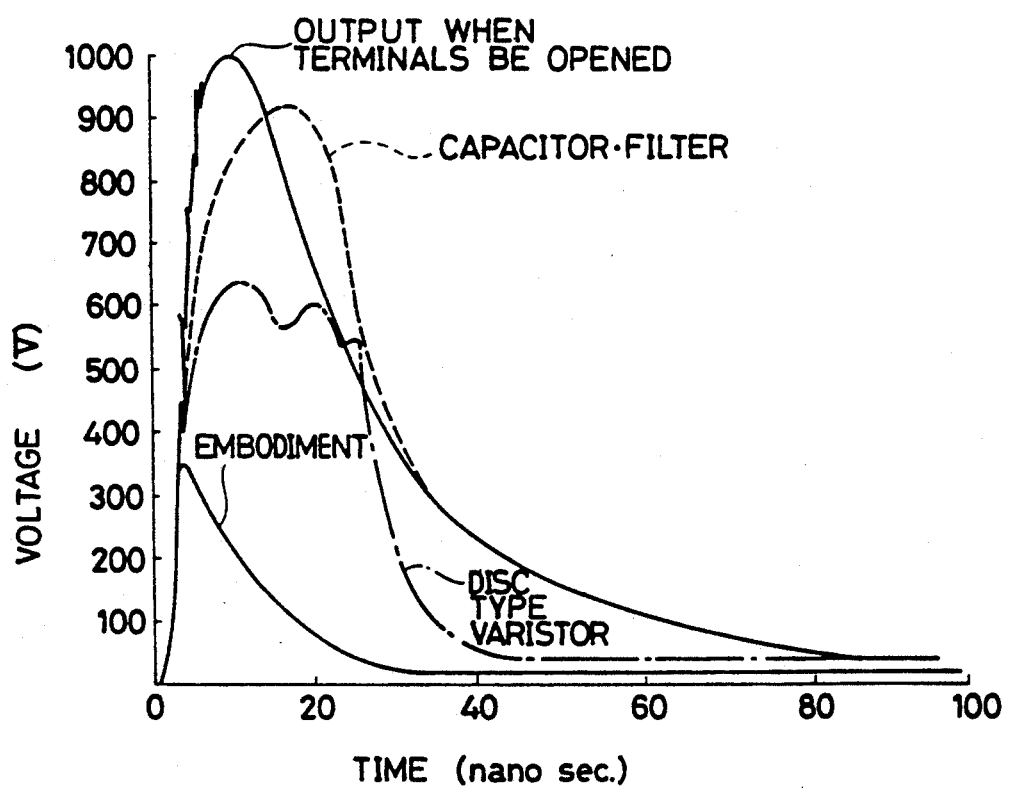
FIG. 6 is a diagram for explaining noise absorbability of the noise filter according to the first embodiment of the present invention and a noise filter in a comparative example.

As can be seen from FIG. 6, in the noise filter according to the present embodiment, pulse-shaped noise can be effectively restrained.

Figure 7:
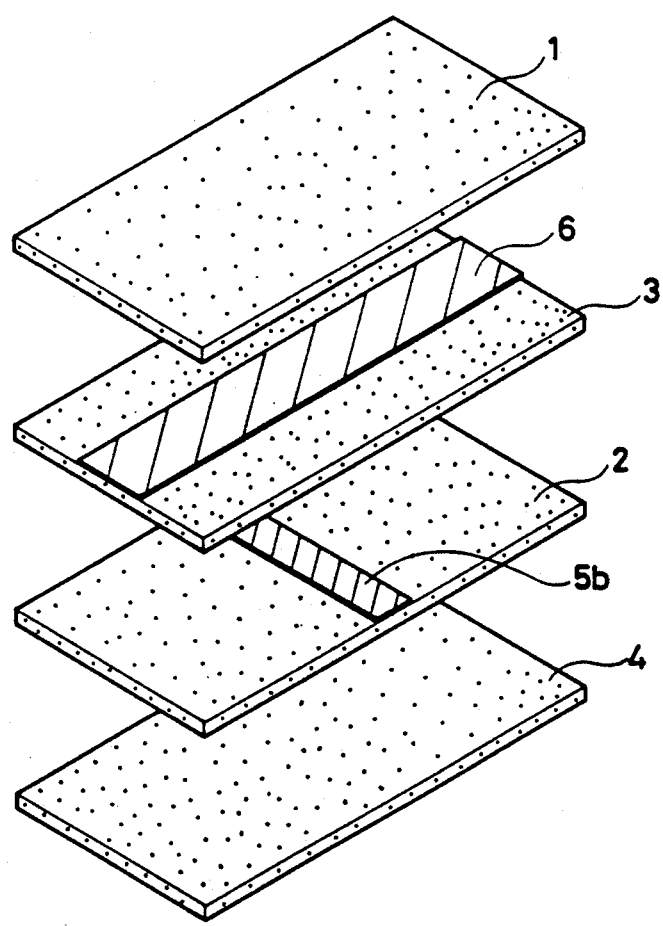
FIG. 7 is an exploded perspective view for explaining ceramic green sheets used in a second embodiment of the present invention and the shape of electrodes formed thereon.

Although in the above described embodiment, three through electrodes are formed as through electrode portions 5a to 5c, a noise filter may be of such construction that only one through electrode portion 5b is arranged below a common electrode portion 6, as shown in FIG. 7. More specifically, in the present invention, the number of through electrodes is arbitrary.

Figure 8:
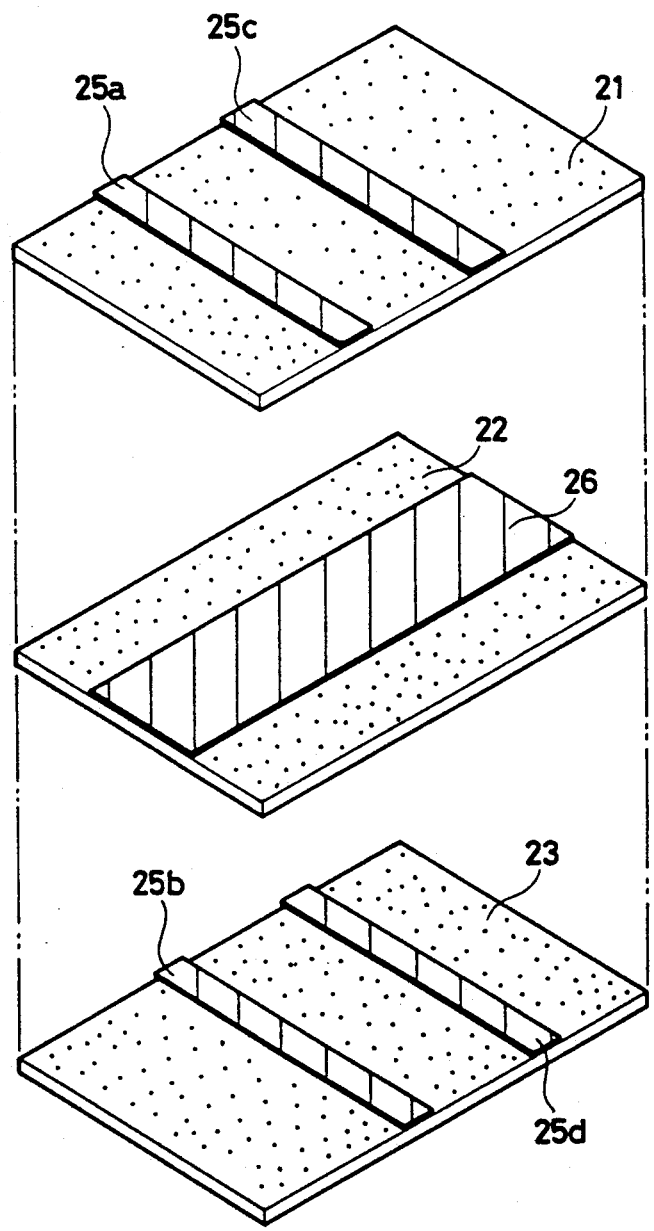
FIG. 8 is an exploded perspective view for explaining ceramic green sheets used in a third embodiment of the present invention and the shapes of electrodes formed thereon.

FIG. 8 is an exploded perspective view for explaining ceramic green sheets used in a noise filter according to a third embodiment of the present invention and the shapes of electrodes formed thereon. Ceramic green sheets 21 to 23 mainly composed of ceramic materials exhibiting varistor characteristics are prepared. A common electrode 26 is formed on the central ceramic green sheet 22 in parallel with a long side of the ceramic green sheet 22. On the other hand, through electrodes 25a and 25c and 25b and 25d are respectively formed on upper surfaces of the ceramic green sheets 21 and 23 in parallel with short sides of the ceramic green sheets 21 and 23. The through electrode 25b is formed so as to be positioned at the center between the upper through electrodes 25a and 25c, and the through electrode 25c is formed so as to be positioned at the center between the lower through electrodes 25b and 25d.

Figure 9:
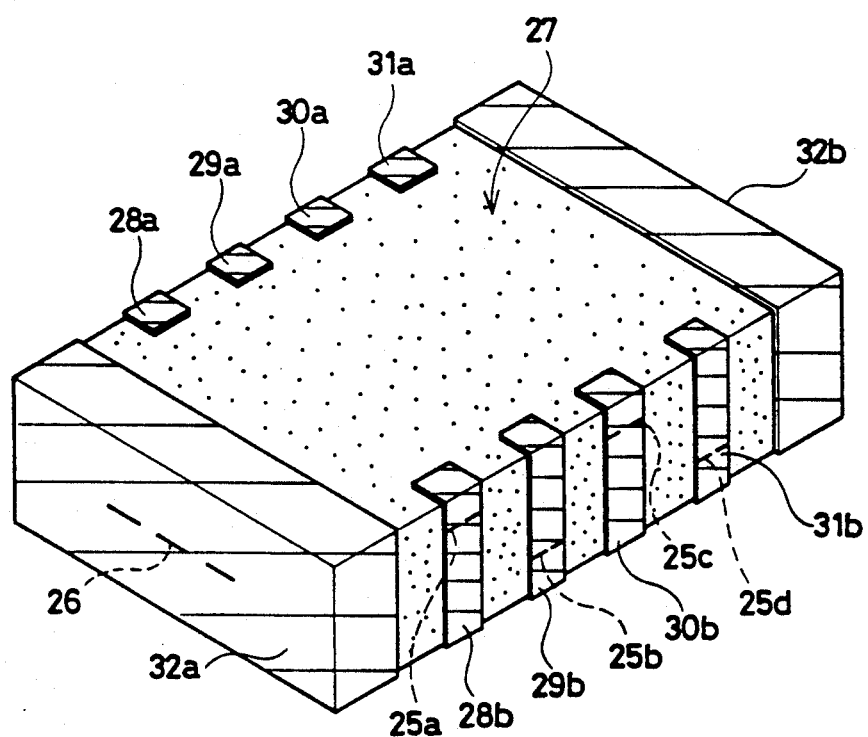
FIG. 9 is a perspective view showing a noise filter according to the third embodiment of the present invention.

The above described ceramic green sheets 21 to 23 are laminated in the direction as shown and ceramic green sheets having no electrodes formed thereon are laminated above the ceramic green sheet 21 and are sintered, thereby to obtain a sintered body 27 shown in FIG. 9. Outer electrodes 28a to 31a, 28b to 31b, 32a and 32b are respectively formed on side surfaces of this sintered body 27. In the noise filter according to the present embodiment, noise filter units are respectively constructed between the outer electrodes 28a to 31a and the outer electrodes 28b and 31b.

Moreover, in the present embodiment, through electrodes adjacent to each other in the traverse direction, for example, the through electrodes 25a and 25b are formed in positions at different heights in the sintered body 27. Accordingly, crosstalk between the adjacent noise filter units can be effectively restrained.

Figure 10:
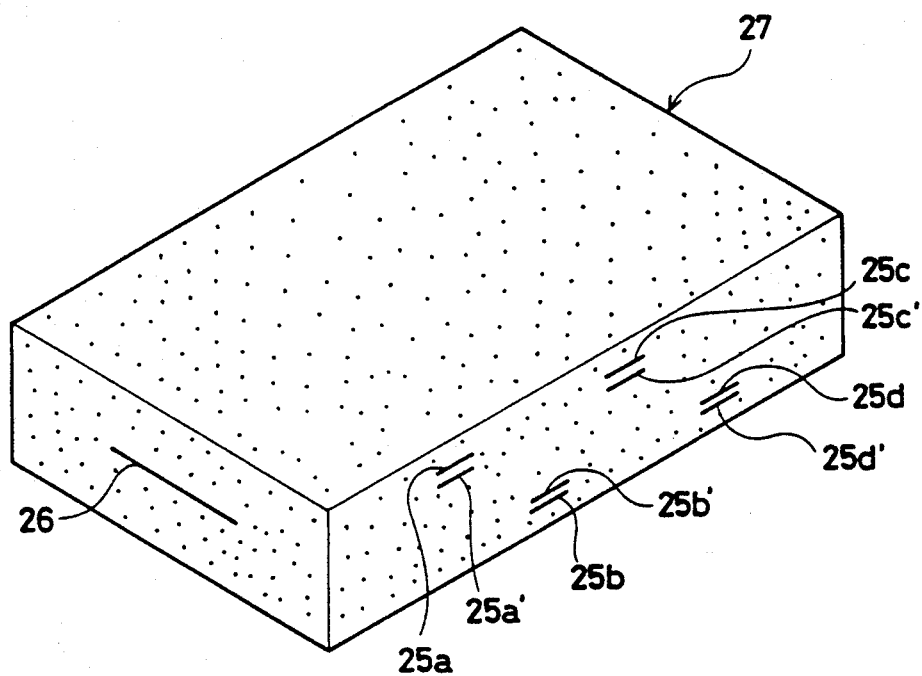
FIG. 10 is a perspective view showing a modified example of the noise filter according to the third embodiment.

Meanwhile, as shown in FIG. 10, the through electrodes respectively constituting the noise filter units may be composed of two through electrode portions 25a and 25a', 25b and 25b', 25c and 25c', and 25d and 25d' which are overlapped with each other through a sintered body layer, respectively.

Figure 11:
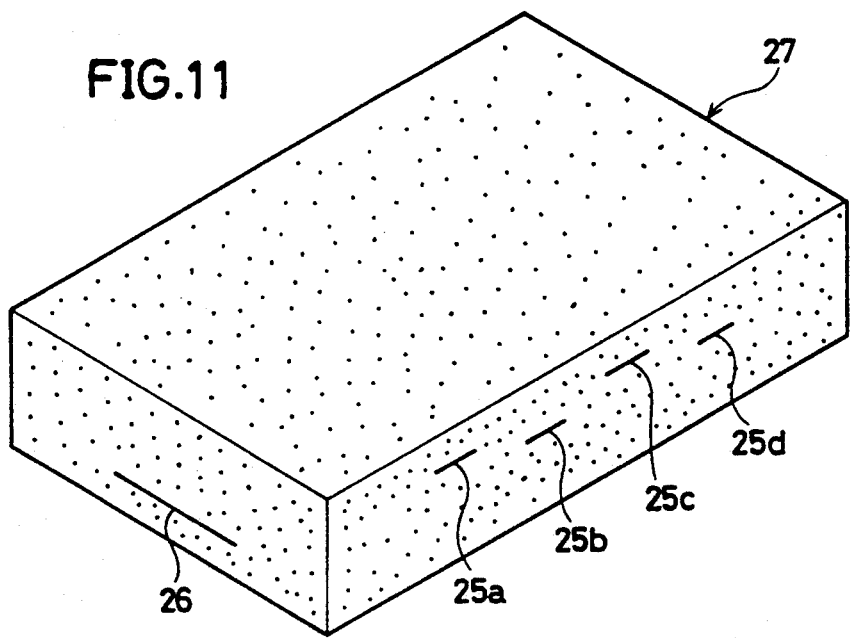
FIG. 11 is a perspective view for explaining a modified example in which a common electrode is arranged below through electrodes.

Furthermore, as shown in FIG. 11, a common electrode 26 may be arranged below the positions at heights where the through electrodes 25a to 25d are formed. However, it is preferable that the adjacent through electrodes, for example, the through electrodes 25a and 25b are arranged on opposite sides of the common electrode 26, as shown in FIGS. 8 and 9. The reason for this is that mutual inference can be effectively prevented by arranging the common electrode 26 connected to an earth potential between the adjacent through electrodes.

Figure 12A:
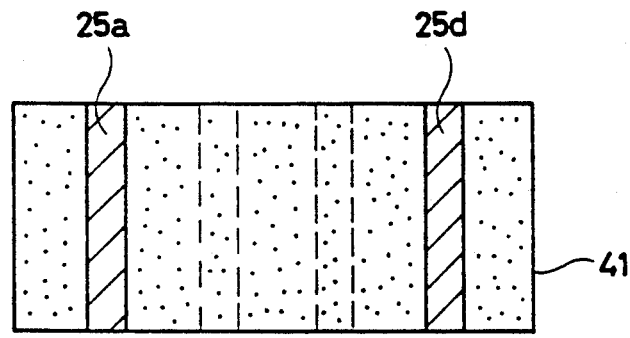
FIGS. 12A to 12E are plan views for explaining ceramic green sheets used in a fouth embodiment of the present invention and the shapes of electrodes formed thereon, respectively.

Additionally, it is not always necessary to form the through electrodes 25a to 25d every other one on the upper surfaces of the two ceramic green sheets, as the embodiment shown in FIG. 8, so as to arrange the through electrodes constituting the adjacent noise filter units in positions at different heights. For example, adjacent through electrodes 25a and 25d may be formed in a distributed manner on three ceramic green sheets, for example, ceramic green sheets 41, 43 and 45 shown in FIGS. 12A, 12C and 12E, thereby to make different the positions at heights where adjacent through electrodes are arranged.

Figure 12B:
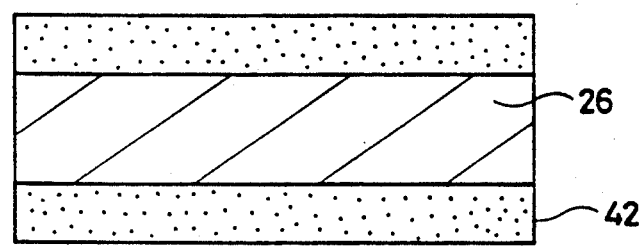
Figure 12C:
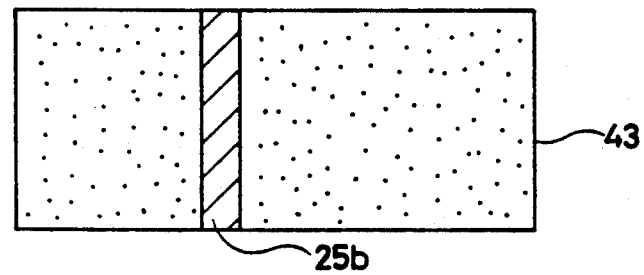
Figure 12D:
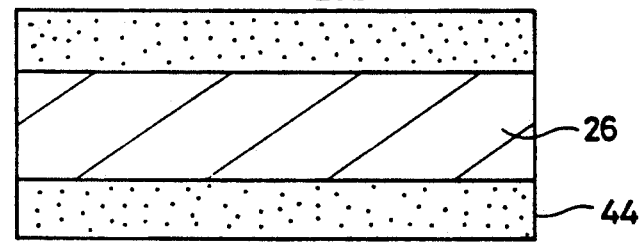
Figure 12E:
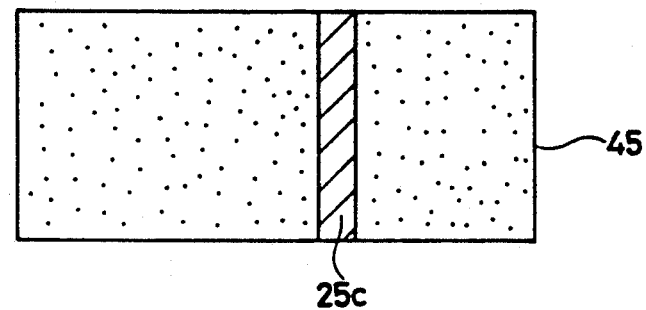

Furthermore, in the example shown in FIGS. 12A to 12E, ceramic green sheets 42 and 44 respectively having common electrodes 26 formed thereon and shown in FIGS. 12B and 12D are inserted between the ceramic green sheets 41, 43 and 45. Thus, a plurality of common electrodes may be formed in a sintered body.

Additionally, a plurality of common electrodes may be formed on one ceramic green sheet.

As described in the foregoing, according to the present invention, a plurality of through electrodes may be formed at positions at different heights, provided that the through electrodes are spaced apart from a common electrode through a sintered body layer and are formed so as to intersect the common electrode.

Moreover, the common electrode and the through electrodes need not be necessarily formed so as to respectively extend between different side surfaces of the sintered body in the example as shown but can be formed so as to extend between arbitrary two portions on outer peripheral side surfaces of the sintered body. More specifically, both ends of the common electrode or the through electrodes may be exposed to one side surface of the sintered body.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A noise filter comprising:
   a monolithic cofired multilayer sintered body comprising a plurality of laminated ceramic layers having varistor characteristics and a set of electrodes separated by said layers;
   said sintered body having a pair of main surfaces which define a direction of thickness therebetween, and an outside surface extending between said main surfaces;
   said set of electrodes comprising:
   a common electrode formed in the sintered body so as to extend from a first portion to a second portion of said outside surface of the sintered body; and
   at least one through electrode spaced apart from said common electrode by at least one ceramic layer in the direction of thickness and extending from a third portion to a fourth portion of the outside surface of said sintered body and crossing said common electrode.

2. The noise filter according to claim 1, wherein a plurality of said through electrodes are formed.

3. The noise filter according to claim 2, wherein said through electrodes adjacent to each other are formed in positions at different heights in the sintered body.

4. The noise filter according to claim 2, wherein said plurality of through electrodes are arranged in a distributed manner on sintered body layers positioned on both sides of the common electrode.

5. The noise filter according to claim 4, wherein the adjacent through electrodes are formed in positions at different heights.

6. The noise filter according to claim 1, wherein said through electrode is constituted by a plurality of through electrode portions overlapped with each other separated by a sintered body layer.

7. The noise filter according to claim 1, wherein a plurality of said common electrodes are formed.

8. The noise filter according to claim 1, wherein the first and second portions of the outside surfaces of said sintered body are a pair of side surfaces opposed to each other of the sintered body, and the third and fourth portions thereof are another pair of side surfaces opposed to each other of the sintered body.

* * * * *